United States Patent [19]

Kerbel

[11] 4,233,564

[45] Nov. 11, 1980

[54] APPARATUS FOR CHANGING THE SCALE OF A LOGARITHMIC SIGNAL

[75] Inventor: Sheldon J. Kerbel, Merrick, N.Y.

[73] Assignee: Hazeltine Corporation, Greenlawn, Nebr.W YORK

[21] Appl. No.: 939,757

[22] Filed: Sep. 5, 1978

Related U.S. Application Data

[62] Division of Ser. No. 818,773, Jul. 25, 1977, Pat. No. 4,158,859.

[51] Int. Cl.[3] .......................... H03K 5/08; G06G 7/24

[52] U.S. Cl. ..................................... 328/145; 307/230; 307/237; 307/264; 328/168

[58] Field of Search ............... 307/230, 261, 264, 237; 328/145, 168, 171, 169; 324/132

[56] References Cited

U.S. PATENT DOCUMENTS

| | | | |
|---|---|---|---|
| 3,234,404 | 2/1966 | Peters | 328/145 X |
| 3,509,368 | 4/1970 | Pedersen | 328/145 X |
| 4,002,977 | 1/1977 | Sun et al. | 328/145 X |

*Primary Examiner*—John Zazworsky

[57] ABSTRACT

With the apparatus described, the logarithmic slope of a signal may be changed so that a relatively flat signal has its scale expanded to make full use of the available voltage range. To do so the supplied logarithmic signal is clamped to a selected voltage level and then linearly amplified to develop an output signal having a logarithmic scale different from that of the supplied signal.

3 Claims, 4 Drawing Figures

APPARATUS FOR CHANGING THE SCALE OF A LOGARITHMIC SIGNAL

This is a division of application Ser. No. 818,773 filed July 25, 1977, now U.S. Pat. No. 4,158,859

BACKGROUND OF THE INVENTION

This invention relates to signal processing apparatus, and particularly to such apparatus as used in systems for simulating a graphic arts process. The apparatus of the invention is particularly useful in connection with a signal transforming apparatus such as a video signal generator which transforms light signals into electrical signals. In a graphic process, an original color image, such as a color transparency, is used in conjunction with filters to provide a set of color separations, which are black and white transparencies representative of a particular elemental color content in a composite color picture. In the usual graphic arts process, the color separations are used in the etching of color printing three or four different color inks on the same piece of paper using printing plates made from the color separations.

The various steps in the color printing process include adjustments for the regulation of the color content of the eventual print. These adjustments are usually made by a skilled operator who must make adjustments according to his judgement to come out with an acceptable color print. In many cases, the process must be repeated after printing plates have been made and a "proof" made with plates. The operator on viewing the proof again must use his own judgement to determine what adjustments to the process are required and must then go through the process of modifying the color separations or printing plates in order to obtain an acceptable color print.

In order to aid in the process of making the printing plates and to attempt to eliminate the need for multiple proof printing, there have been developed prior art systems for simulating the color printing process. Such prior systems are disclosed in U.S. Pat. Nos. 3,123,666 to Bailey: 3,128,333 to Loughlin; 3,131,253 Farber et al.; and 3,800,071 to Reeber, all of which are assigned to the same assignee as the present invention. These prior patents disclose previewing systems which simulate either all, or a portion of, the color printing process and provide a display representative of a color print. The present invention is particularly useful in systems of this type.

In a color printing process previewing system, it is particularly important that there be obtained a very accurate video signal which is representative of the original image. Unlike conventional color TV which used separate signals for brightness (i.e. black and white) and color information (with reduced bandwidth), previewing usually use at least three separate video signals, each representing the elemental color content of the original image. This results in a higher quality color image simulation and display. The three video signals may be derived by the use of a vidicon tube, according to the method taught by Farber et al., or may be derived by using a scanning light source and a photodetector tube. In either case, it is desirable to convert the video. signals into logarithmic signals in order to facilitate their subsequent processing. However, the resulting logarithmic signals may have a dynamic range which is less than that which can be optimally processed in subsequent circuits. In that case it would be desirable to be able to change the logarithmic scale of the signal so that a selected range of logarithmic representative voltages is fully utilized to represent the video signal.

It is therefore an object of the present invention to provide apparatus which is capable of changing the logarithmic scale of a supplied logarithmic signal.

SUMMARY OF THE INVENTION

In accordance with the invention, there is provided an apparatus for modifying the scale of a supplied logarithmic signal having a reference level. The apparatus includes means for generating a clamping signal having a selected voltage level, a clamping circuit for clamping the level of the supplied logarithmic signal to the level of the clamping signal, and means for linearly modifying the amplitude of the clamped logarithmic signal to generate an output logarithmic signal having a different logarithmic scale. The linear modifying means may include a linear amplifier, a voltage divider, or both.

For a better understanding of the present invention, together with other and further objects, reference is made to the following description, taken in accordance with the accompanying drawings, and its scope will be pointed out in the appended claims.

DESCRIPTION OF THE INVENTION

Figure 1:
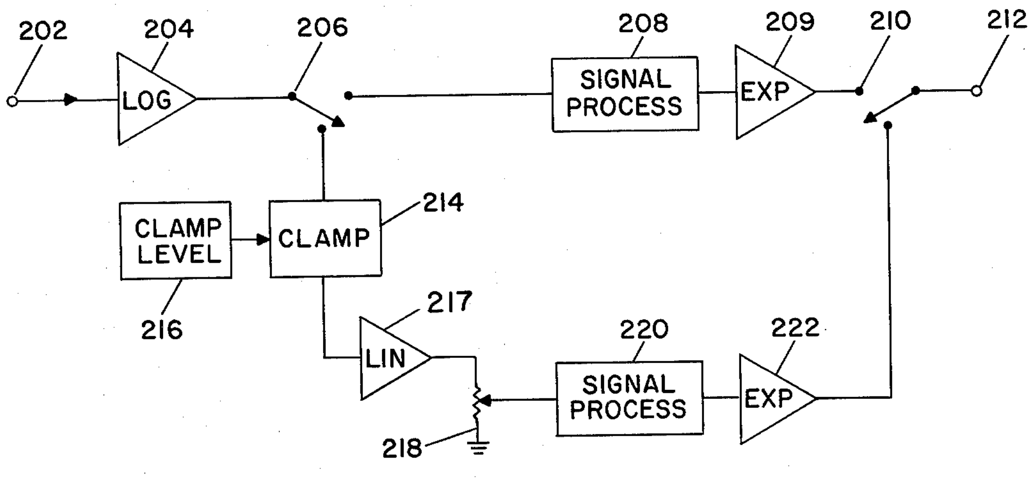
FIG. 1 is a block diagram of a circuit for changing the scale of a logarithmic signal.

FIG. 1 is a block diagram illustrating a circuit for modifying the scale of a logarithmic signal. In certain applications, particularly a graphic arts previewing apparatus of the type shown in FIG. 1 of applicant's co-pending application, Ser. No. 818,773, filed July 25, 1977, it is desirable to convert video signals into logarithmic signals to facilitate signal processing. For example, it is often desirable to store video signals in logarithmic form because this signal form has a reduced range of minimum to maximum signal level. In some operations, a video signal may have a dynamic range substantially less than the full range of other signals. For example a vidicon is capable of providing a video signal with a logarithmic density range of 2.7. When such previewing apparatus is operated with color separations as the input image, the separations may have a density range of only 1.6. In order to make full use of the capabilities of signal processing or storage devices, it is desirable to change the logarithmic scale so that a selected range of logarithmic representative voltages is fully utilized to represent the video signal.

Figure 2A:
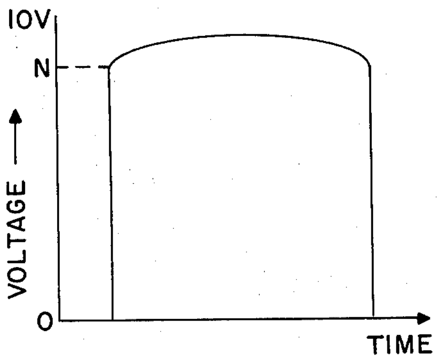
FIGS. 2A, 2B, and 2C are graphs illustrating the operation of the FIG. 1 circuit.

FIG. 2A illustrates a video signal of a simple form, which may represent the field illumination variation for a graphic arts previewer. It is noted that although a 10 volt range is available, only a small amount of this voltage range conveys useful information. The logarithmic signal of FIG. 2A may be expressed as follows:

$$L_1 = K_1 \log_{10} A + P_1 \quad (1)$$

where $K_1$ is the slope, $P_1$ a pedestal level and A is the linear signal function.

A logarithmic signal with a different logarithmic slope may be expressed as follows:

$$L_2=K_2\log_{10}A+P_2 \quad (2)$$

and:

$$L_2=M(L_1+N) \quad (3)$$

where $$M=K_2/K_1 \quad (4)$$

and:

$$N=(K_1/K_2)P_2-P_1 \quad (5)$$

It will be evident from Equation 3 that the slope (and range) of a logarithmic signal may be adjusted by adding (or subtracting) a pedestal (N) to the signal and then linearly modifying the amplitude. The circuit shown in FIG. 1 is capable of processing a logarithmic signal with or without an adjustment in the logarithmic slope. An amplitude representative linear signal is supplied at input terminal 202 and converted to a logarithmic signal in logarithmic amplifier 204. If the logarithmic signal has its normal dynamic range, switch 206 will be in a position to supply the signal to processing circuit 208, which may be an A to D converter, a signal modifier, or a storage unit. The original amplitude representative signal may be generated from the logarithmic signal in exponential amplifier 209 which may be connected to output terminal 212 by switch 210.

Figure 2B:
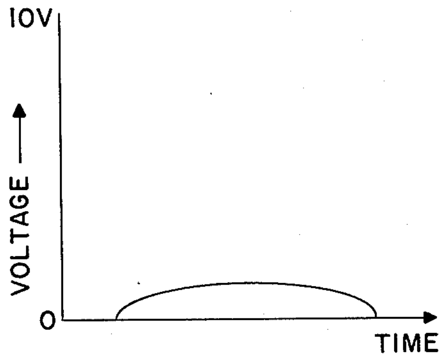
Figure 2C:
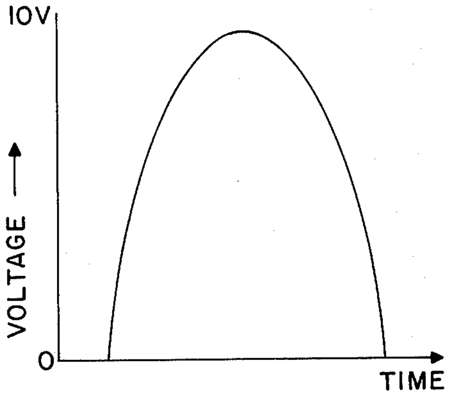

In the event the amplitude representative signal supplied to terminal 202 has less than the usual dynamic range, for example a field illumination signal shown in FIG. 2A, switch 206 may be changed so that the logarithmic signal from amplifier 204 is supplied to clamping circuit 214. Clamping circuit 214 is also supplied with a pulse signal from clamping level circuit 216. The pulse has a level corresponding to N in Equations (3) and (5) and a duration equal to the signal clamping interval. Clamping circuit 214 clamps the logarithmic signal to the level of the supplied clamping pulse from clamping level circuit 216 by inserting the pulse as the clamping level thereby changing the FIG. 2A signal into the clamped signal of FIG. 2B. A linear amplifier 217 may be used to bring the signal of FIG. 2B back to the full dynamic range, such as is shown in FIG. 2C. Thus, the logarithmic slope of the signal has been changed so that a relatively flat signal has its signal scale expanded so that it has a scale which makes full use of the available voltage range. This process is particularly helpful where the signal is to undergo a digital conversion. With the signal format of FIG. 2A, in the event digital samples of the signal level are measured, many bits of sampling and storage will be wasted, since many bits will always be full for any sample. When a signal is represented by the waveform shown in FIG. 2C, in the event of a digital conversion the bit samples will be more economically used, and will be representative of finer variations in the original signal. The signal processing apparatus 220 and exponential amplifier 222 which receives the signal shown in FIG. 2C are configured to accept a signal with a modified logarithmic scale. Switch 210 may be used to supply the restored amplitude representative signal from exponential amplifier 222 to output terminal 212. Those familiar with the art will recognize that voltage divider 218 may be used alone, or in combination with linear amplifier 217 to adjust the value of the multiplication constant M in the process of changing the logarithmic slope and thereby negative as well as positive scale changes can be accomplished.

While there has been described what is believed to be the preferred embodiment of the invention, those skilled in the art will recognize that modifications may be made thereto without departing from the spirit of the invention, and it is intended to claim all such modifications as fall within the true scope of the invention.

I claim:

1. Apparatus for modifying the scale of a supplied logarithmic signal having a reference level, comprising:
   means for generating a clamping signal having a selected voltage level;
   a clamping circuit for clamping the level of said logarithmic signal to the level of said clamping signal;
   and means for linearly modifying the amplitude of said clamped logarithmic signal thereby to generate an output logarithmic signal having a different logarithmic scale than said supplied logarithmic signal.

2. Apparatus as specified in claim 1 wherein said means for linearly modifying signal amplitude comprises a linear amplifier.

3. Apparatus as specified in claim 1 wherein said means for linearly modifying signal amplitude comprises a voltage divider.

* * * * *